Figure 1:
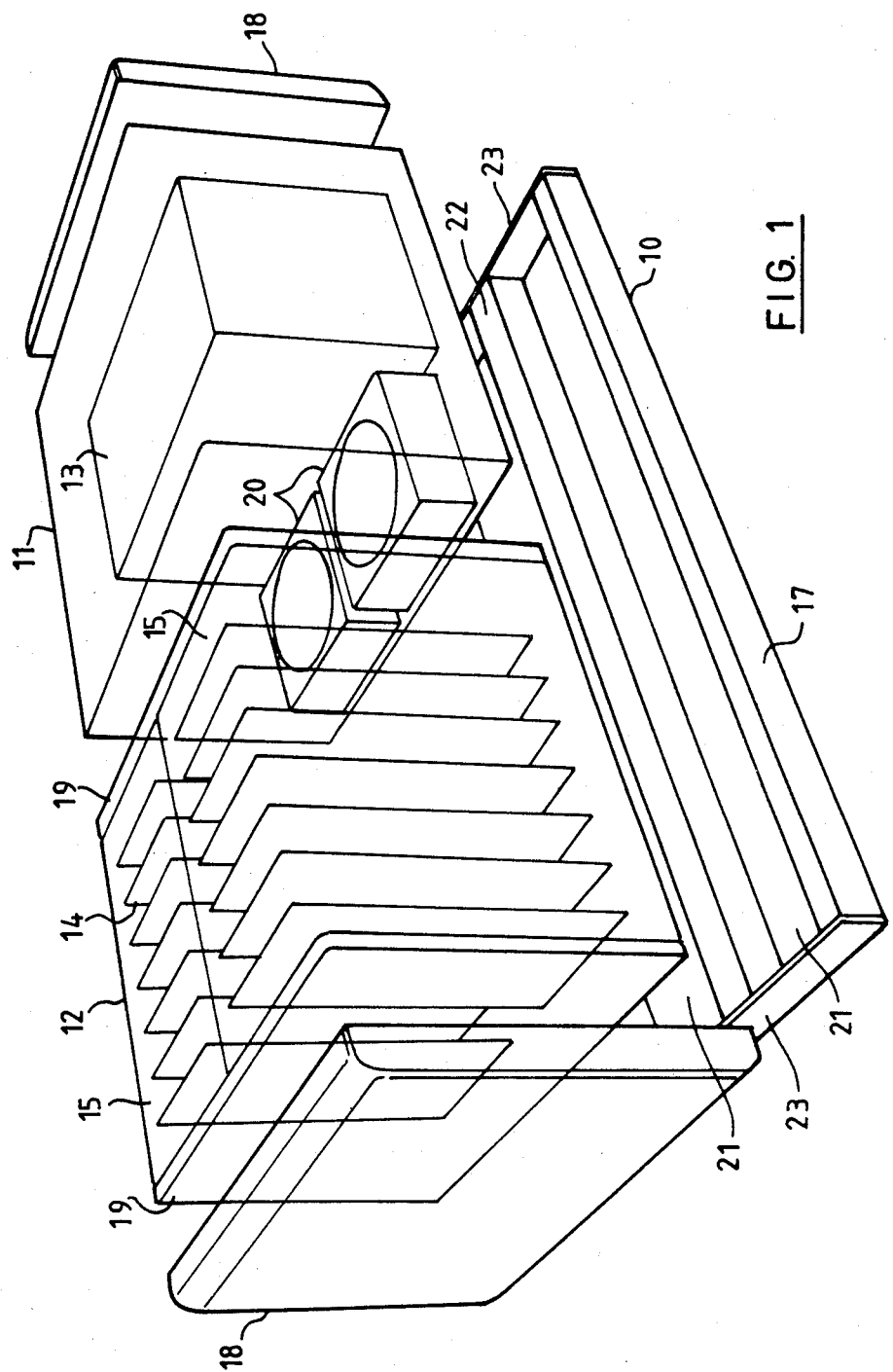

United States Patent [19]

Davis et al.

[11] Patent Number: 4,513,351
[45] Date of Patent: Apr. 23, 1985

[54] ELECTRONIC ASSEMBLY WITH FORCED CONVECTION COOLING

[75] Inventors: Michael I. Davis; Michael J. Garrett; John A. Wiseman, all of Winchester, England

[73] Assignee: International Business Machines Corporation, Armonk, N.Y.

[21] Appl. No.: 536,122

[22] Filed: Sep. 26, 1983

[30] Foreign Application Priority Data

Sep. 29, 1982 [EP] European Pat. Off. ........ 82305175.0

[51] Int. Cl.$^3$ .............................................. H05K 7/20
[52] U.S. Cl. ...................................... 361/384; 34/150; 165/126; 361/394
[58] Field of Search ........................... 34/20, 233, 150; 62/414, 418; 165/126; 361/381–384, 391–394; 174/15 R, 16 R

[56] References Cited

U.S. PATENT DOCUMENTS

| 3,592,260 | 7/1971 | Berger | 361/384 |
| 3,710,476 | 3/1971 | Hollingsead | 361/383 |
| 4,149,218 | 4/1979 | Carrubba | 62/418 |

OTHER PUBLICATIONS

Cooling Electrical Equipment, Gaunt, IBM Tech. Discl. Bull., vol. 20, No. 6, Nov. 1977, p. 2428.

Primary Examiner—G. P. Tolin
Attorney, Agent, or Firm—W. S. Robertson

[57] ABSTRACT

An electronic assembly with forced convection cooling comprises an elongate support plate having a plurality of electronic equipment cabinets mounted side by side on a common surface of the plate in the longitudinal direction thereof. At least one air distribution channel extends longitudinally of the plate in the said common surface, and a cooling fan is mounted on the same surface of the plate as the cabinets for forcing air along the air distribution channel and into the cabinets for cooling electrical components therein.

The assembly preferably includes means for directing air from the channel selectively in different quantities to different components according to their cooling requirements, such means including a plurality of secondary air distribution channels which branch laterally from the first mentioned channel, and means for confining air from the first mentioned channel to flow into the secondary channels.

4 Claims, 6 Drawing Figures

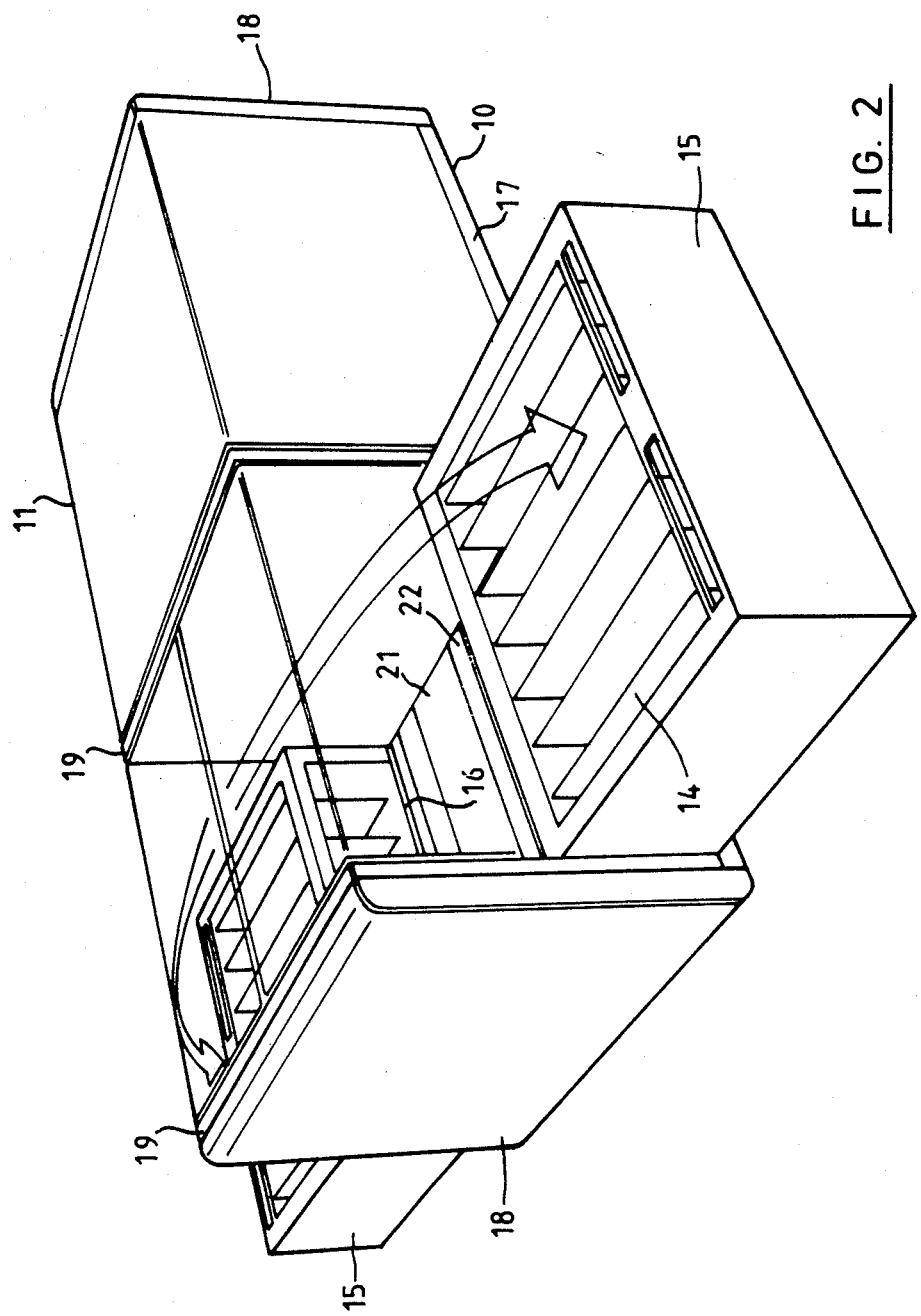

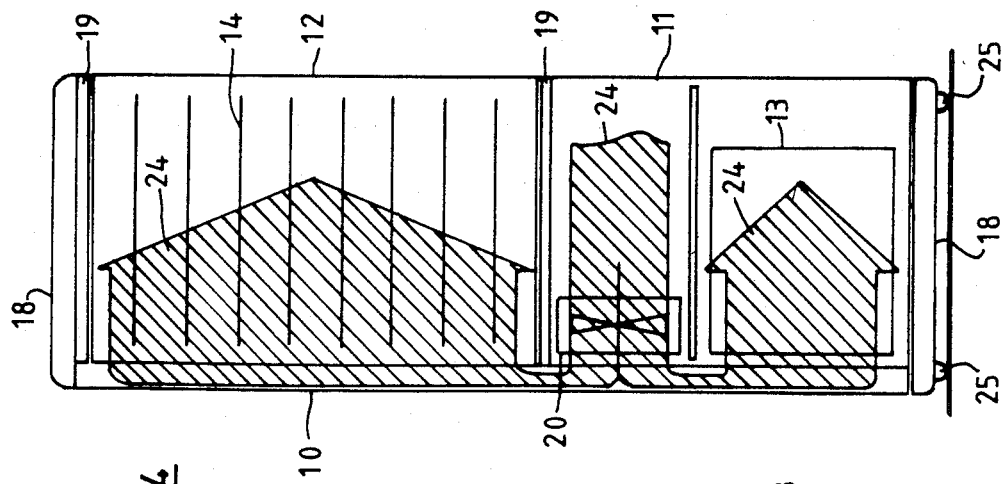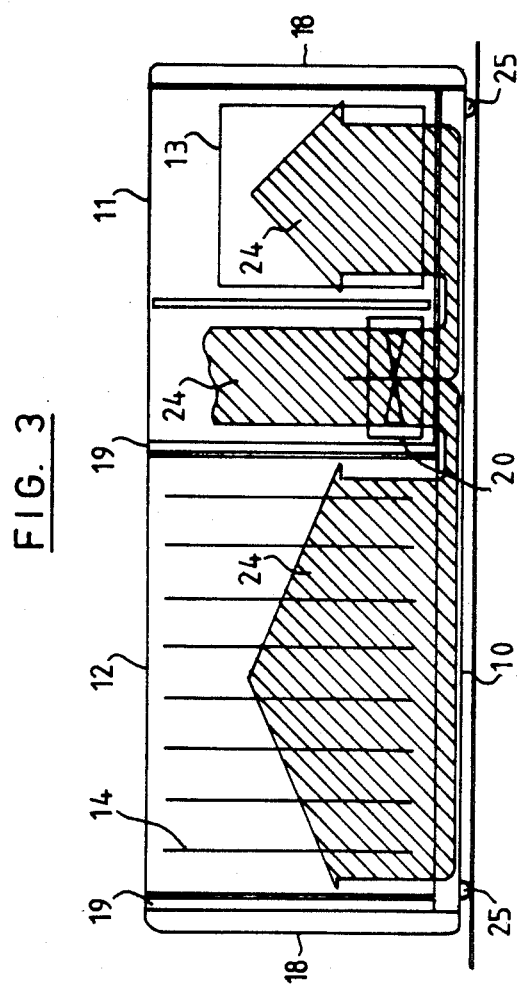

ELECTRONIC ASSEMBLY WITH FORCED CONVECTION COOLING

This invention concerns an electronic assembly including forced convection cooling.

Heretofore the cooling of components in electronic equipment cabinets has either been achieved by natural convection or, where forced convection is used, by providing individual cooling fans where necessary for different equipment cabinets in an assembly. The former approach restricts the "in use" orientation of the cabinets since only one orientation will give proper cooling of the components, and furthermore this approach cannot cope with components with a high heat dissipation. The second approach is characterised by a relatively high capital cost of the cooling equipment and does not lend itself readily to the design of modular systems.

The object sought to be achieved by the invention is to provide cooling and packaging of a small electronic assembly at low cost and in a manner which permits a high degree of modularity. Furthermore, the system should be capable of extension, by the addition of further cabinets, while preserving the modular nature of the assembly and without expensive changes to the cooling arrangement. Finally, the assembly should be capable of a choice of orientation in use.

Accordingly, the invention provides an electronic assembly including forced convection cooling, comprising an elongate support plate, a plurality of electronic equipment cabinets mounted side by side on a common surface of the plate in the longitudinal direction thereof, at least one air distribution channel extending longitudinally of the plate in the said common surface, and a cooling fan mounted on the same surface of the plate as the cabinets for forcing air along the air distribution channel and into the cabinets for cooling electrical components therein. It will be appreciated that the air flow may be from the channel to the cabinets or vice versa according to the direction of rotation of the fan.

The advantages of the invention are that a common cooling arrangement is used for the different electronic equipment cabinets, the cooling arrangement also serving as a mount for the cabinets so as to provide overall a self-supporting package. The cooling arrangement is cheap and compact, and can accommodate changes in the number and type of cabinets simply by changing the design of, and/or extending the length of, the support plate. Furthermore, the fact that the cooling air enters and leaves the assembly on the same side of the support plate permits the latter to be orientated horizontally as a base for the system or vertically to allow the assembly to be used, for example, as a desk pedestal.

As will be described, the invention permits mixtures of logic cards, boards, power supplies and I/0 devices to be housed in a single family of packages of standardised and dimensions and uniform aesthetic appearance.

Figure 5:
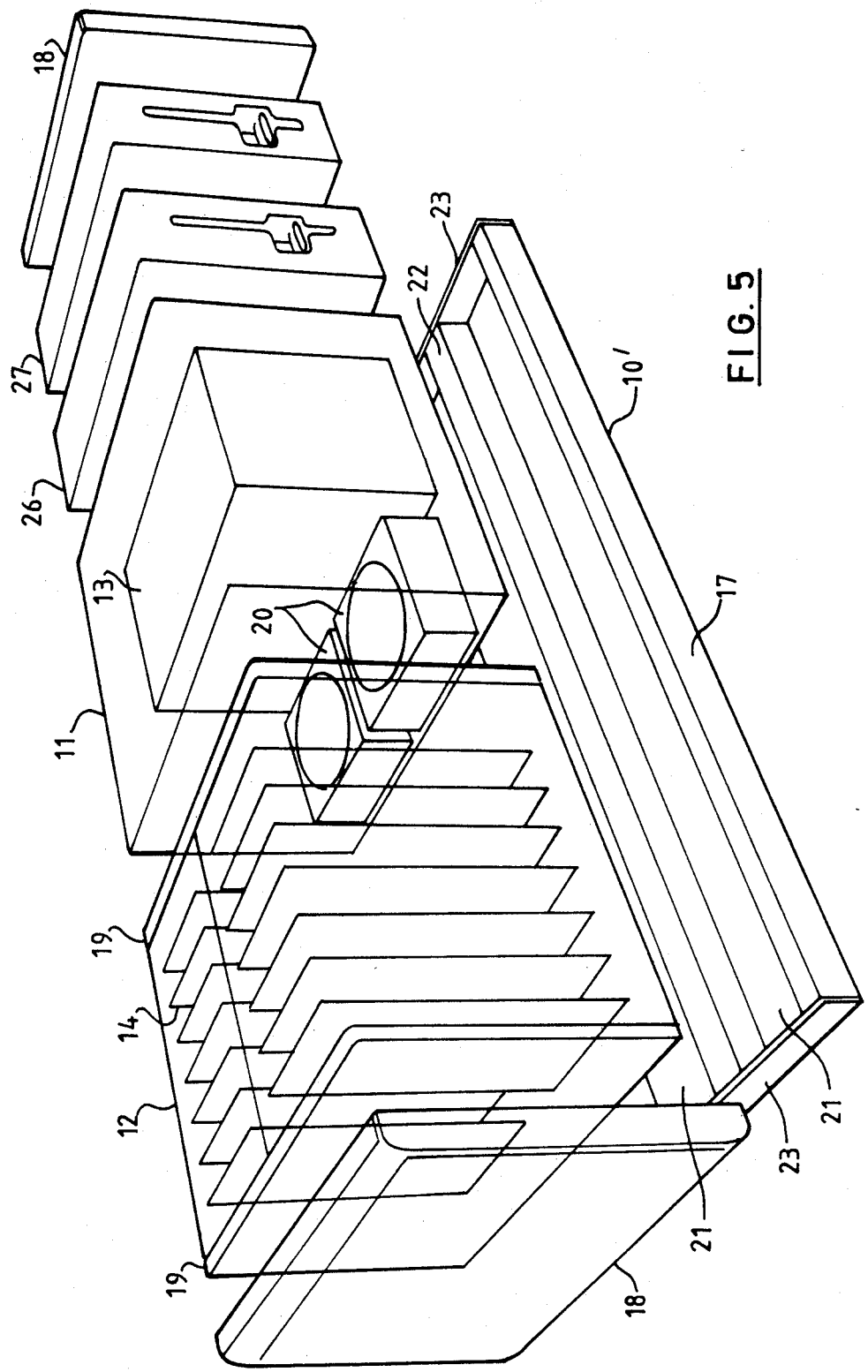
Figure 6:
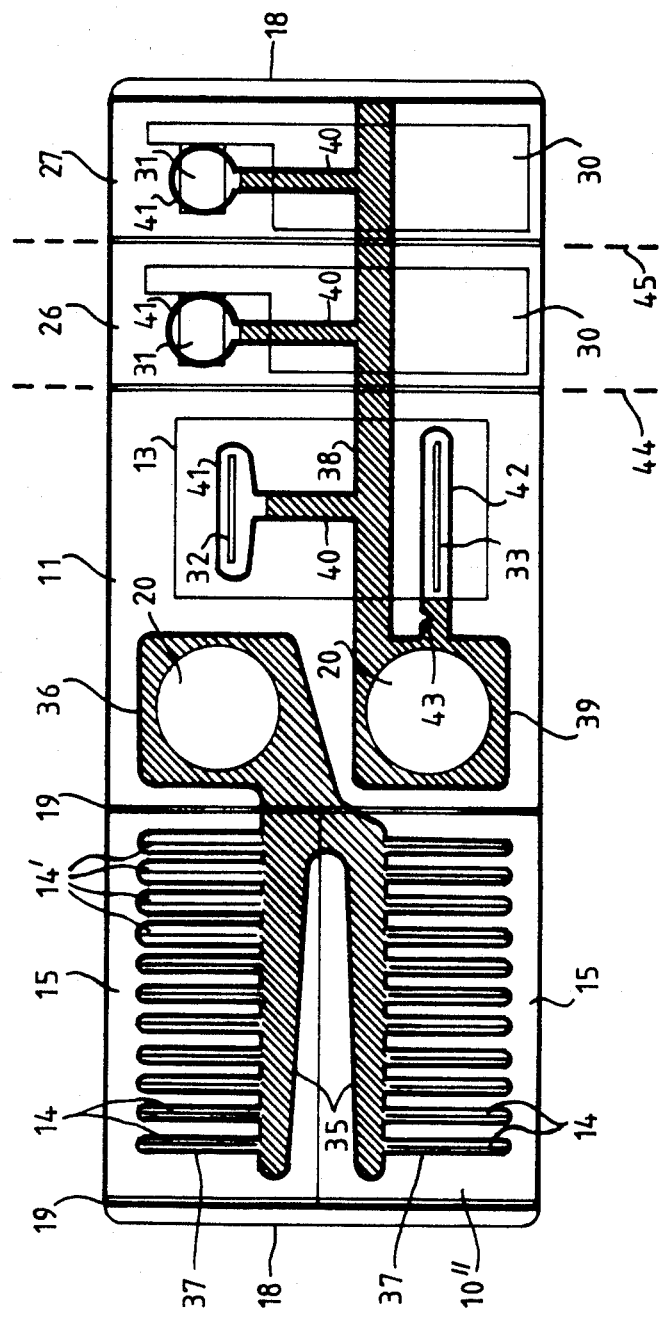

Embodiments of the invention will now be described, by way of example, with reference to the accompanying drawings, wherein:

FIG. 1 is an exploded perspective view of a first embodiment of an assembly according to the invention, FIG. 2 is a perspective view of the embodiment of FIG. 1 showing the hinging of the logic gates, FIG. 3 is a sectioned side view of the embodiment of FIG. 1 illustrating the general direction of air flow, FIG. 4 is a view similar to FIG. 3 showing the assembly stood on one end, FIG. 5 is an exploded perspective view of a second embodiment of the invention, being an adaptation of the first embodiment extended to include further electronic equipment to be packaged and cooled, and FIG. 6 is a schematic plan view of an alternative base support plate layout for the apparatus of FIG. 5.

Referring first to FIGS. 1 to 3, a small electronic assembly includes a rigid base support plate 10 of rectangular shape with a pair of electronic equipment cabinets 11 and 12 mounted side by side on the upper surface of the plate 10 in the longitudinal direction of the plate. The cabinet 11 in this example includes a power supply 13 and the cabinet 12 includes a plurality of logic cards 14. The cards 14 are arranged in two parallel rows symmetrically on either side of the longitudinal centre line of the apparatus. Each such row of cards is mounted in a respective logic gate 15, the two logic gages 15 collectively constituting the major part of the cabinet 12. The logic gates 15 are hinged at 16 adjacent the side edges 17 of the support plate 10 so that they can be swung virtually outwards from between the end faces 19 of the cabinet 1, FIG. 2, for access and servicing. However, the logic gates 15 are normally latched together as seen in FIG. 1. End caps 18 secured to the outer faces of the cabinets 11 and 12 complete the assembly.

The electrical components of the assembly are cooled by forced convection by two fans 20 mounted in the cabinet 11. Each fan 20 overlies a respective longitudinal air distribution channel 21 in the same surface of support plate 10 as that on which the cabinets 11 and 12 are mounted, the two channels 21 being separated by a central dividing wall 22. Each fan 20 forces air under pressure along its respective channel 21 and, since the ends of the channels are blocked by transverse end walls 23, the air is forced upwards into the cabinets 11 and 12 to cool the power supply 13 and logic cards 14 respectively. The general direction of the air flow is shown at 24 in FIG. 3, although it is to be understood that the flow may be reversed by reversing the fans 20.

To ensure that air does not escape in significant quantities from between adjacent cabinets, the cabinets 11 and 12 and the end caps 18 are mounted closely adjacent one another on the support plate 10, if necessary with intervening resilient gaskets (not shown). Such gaskets may also be used to seal any small gaps between the cabinets and the edges 17 of the support plate 10. In this way the air from the fans 20 is forced to flow upwardly into the cabinets as described, the lower surfaces of the cabinets being open to the channels 21 to permit such air flow to occur. Air entrance and exit to the assembly occurs through ventilation grills (not shown) in the cabinets.

Although the channels 21 are shown as closed at each end by transverse end walls 23, this function could alternatively be performed by the end caps 18 which, as shown in FIG. 3, extend fully to the bottom of the support plate 10.

It is to be understood that the assembly is self-supporting, cohesion being provided primarily by the rigid support plate 10 on which the cabinets 11 and 12 are securely mounted. Such mounting is preferably by releasable securing means so that each cabinet may be individually removed and replaced for servicing. However, additional overall support may be achieved by releasably securing adjacent cabinets together. For rigidity and structural strength the base support plate 10 is preferably formed of structural foam or diecast metal;

by contrast the cabinets 11 and 12 are made as light as possible using cast or moulded plastics material.

This self-supporting design is such that the orientation of the assembly can be changed to suit the user's needs. For example, for horizontal mounting on a desk top (FIG. 3) rubber feet 25 may be inserted into existing holes in the underside of the support plate 10. By comparison, the use of an end cap 18 equipped with holes for the same rubber feet 25 would permit a free-standing floor-mounted assembly (FIG. 4) capable of residing under a table. Yet another end cap design (not shown) would permit the assembly to become an integral part of a desk (e.g. act as one pedestal).

FIG. 5 illustrates the modular nature of the assembly and how the assembly may be readily expanded by the addition of further equipment. In this case the further equipment comprises two diskette units housed in cabinets 26 and 27. The only significant expense involved in the addition of these units (apart from the cost of the units themselves) is the provision of an extended base support plate 10', the new plate 10' being longer than the original plate 10 by the width of the two units 26 and 27. Since the base support plate 10' represents only a small part of the cost of the assembly overall, the cost of expanding the assembly is minimal. It will be noted that all the cabinets 11, 12, 26 and 27 have a substantially common rectangular cross-section in a plane normal to the longitudinal direction of the support plate 10' and extend the full width of the latter. The assembly therefore presents a pleasing aesthetic appearance.

In the foregoing it has been tacitly assumed that the air distribution channels 21 are of substantially constant cross-section along their length, and that the air is forced more or less non-selectively up into the various cabinets for cooling the components therein. However, the cross-section of each channel 21 may, and in practice would, be varied along its length as regards depth and/or width to provide the appropriate impedance to ensure a correct distribution of air to all parts of the assembly, taking into account the impedence naturally occurring by virtue of the components themselves. By this means the air can be directed from the channel selectively in different quantities to different components according to their cooling requirements. This selective distribution of the air can be assisted by closing off part of the lower surface of the cabinets leaving apertures only where air is required to enter the cabinet, and/or by the use of louvres attached to components to be cooled and which protrude into the channels 21.

The ultimate objective is to "tune" the channels 21 so that each component to be cooled receives just sufficient air flow for this purpose. While this ideal case is of course impossible to achieve with precision, the above techniques provide ample scope for the designer to approximate the ideal conditions, thereby permitting the use of fans of substantially lower power than the case where a nonselective distribution of air is effected.

An example of a further technique for tuning the air flow, which may be used in addition to the techniques described above, is illustrated in FIG. 6. FIG. 6 is a schematic plan view of an assembly incorporating the same electronic equipment cabinets as FIG. 5, but which uses a different air distribution channel layout in the base support plate, here referenced 10". The bold lines represent the support plate 10", whereas the thinner lines represent the overlying cabinets and internal components. The same reference numerals have been used as in the preceding figures where appropriate.

In FIG. 6, the diskette units are shown at 30 and each has a motor 31. The power supply 13 has a control card 32 and a regulator card 33. The logic gates 15 include for the most part logic cards 14 of normal heat dissipation, but four cards 14' have a high heat dissipation. The motors 31 and the power supply cards 32 and 33 have a high heat dissipation and, like the logic cards 14', need more cooling air than, for example, the logic cards 14. This is achieved by the particular design of support plate 10" shown. The plate 10" includes a bifurcated first main air distribution channel 35 extending longitudinally of the plate to the left as viewed. The channel 35 is supplied with cooling air under pressure from an air plenum 36, the latter being directly below one of the fans 20. Each bifurcation of the main channel 35 has a plurality of secondary air distribution channels 37 branching laterally therefrom, each secondary channel 37 directly underlying a respective logic card 14 or 14'. Air flowing into the main channel 35 from the plenum 36 is confined to flow into the secondary channels 37 by blocking the exit of air from the top of the main channel 35 as indicated by hatched lines. This is achieved by appropriate design of the lower surface of each cabinet. The secondary channels 37 are, however, not blocked and therefore air may flow upwards from each to cool the respective card 14 or 14' immediately above, the secondary channels 37 associated with the "hot" cards 14' being wider than those associated with the cards 14 thereby permitting a greater flow of cooling air to these cards. It will be noted that the width of the bifurcations of the channel 35 decreases away from the plenum 36, thus increasing impedance and maintaining adequate air pressure in the channel throughout its length.

The diskette motors 31 and control card 32 are cooled by air from a second main air distribution channel 38 extending longitudinally of the plate 10" to the right. The channel 38 is supplied with air under pressure from a second air plenum 39 directly under the other fan 20, and has three lateral branch channels 40 each terminating in an enlarged end 41 underlying a respective one of the components 31 and 32 to be cooled. In this case only the top of the main channel 38 is blocked but as the hatched lines indicate air is confined by the cabinet design to flow substantially fully to the enlarged end 41 of each secondary channel 40, so that substantially all the air entering the channel 38 is directed onto the motors 31 and control card 32. As indicated above, the impedence of the main and secondary channels is varied as necessary to provide a flow of cooling air appropriate to the heat dissipation of each component.

Finally, the regulator card 33 is cooled by a single narrow channel 42 extending from the plenum 39. This card 33 could have been cooled by a branch channel 40 as for the card 32, but its proximity to the plenum 39 made direct cooling from the plenum simpler. However, in order to prevent too great an air flow past the card 33 due to its close proximity to the plenum 39, the entrance to the channel 42 is restricted at 43.

It will be seen that in the design shown in FIG. 6 air is directed specifically and at least approximately in the correct quantities to each component requiring cooling, thereby providing a greater efficiency than if the air were permitted to flow indiscriminately upwardly from the main channels.

FIG. 6 also provides a modular assembly. Thus for the basic equipment shown in FIGS. 1 to 3 one would terminate the support plate 10" at the line 44, and if only one diskette unit were required one would terminate the plate 10″ at the line 45. In each case the right hand end cap 18 would be moved up and secured to the remaining cabinet on the right.

It is to be understood that further channels may be cast or machined into the support plate to accommodate cabling between the various components. This may take the form of discrete, bundled or tape cables running between various components, or solid conductors may be embedded in the support plate.

We claim:

1. An electronic assembly with forced convection cooling, comprising an elongated support plate, a plurality of electronic equipment cabinets with electrical components therein mounted side by side on a common surface of the plate in the longitudinal direction thereof, said support plate having at least one air distribution channel extending longitudinally of the plate in said common surface and open to the equipment cabinets and closed at its ends for air distribution between the cabinets and the channel, and a cooling fan mounted in one of the cabinets at a longitudinal position of the channel and forcing air (1) between the fan and the cabinets and cooling some of the electrical components therein and (2) along the air distribution channel in opposite direction between the fan and each of said ends and (3) between the air distribution channel and the cabinets for other cooling of electrical components therein.

2. An assembly according to claim 1, wherein the cross-section of said air distribution channel is varied along its length to provide the appropriate impedance for directing air from the channel selectively in different quantities to different components according to their cooling requirements.

3. An assembly according to claim 2, including means establishing a plurality of secondary air distribution channels which branch laterally from said support plate channel, and means for confining air from said support plate channel to flow into the secondary channels according to the cooling requirements of components along the secondary channels.

4. An assembly according to claims 1, 2 or 3, wherein the cabinets have a substantially common rectangular cross-section in a plane normal to the longitudinal direction of the support plate and extend substantially the full width of the support plate.

* * * * *